United States Patent [19]

Chang

[11] 4,303,715

[45] Dec. 1, 1981

[54] PRINTED WIRING BOARD

[75] Inventor: Joseph J. Chang, Ewing Township Mercer County, N.J.

[73] Assignee: Western Electric Company, Incorporated, New York, N.Y.

[21] Appl. No.: 99,389

[22] Filed: Dec. 3, 1979

Related U.S. Application Data

[60] Continuation of Ser. No. 913,430, Jun. 7, 1978, abandoned, which is a division of Ser. No. 785,480, Apr. 7, 1977, Pat. No. 4,107,837.

[51] Int. Cl.³ .................. B05D 5/12; B32B 3/24; H05K 1/05
[52] U.S. Cl. .................... 428/137; 29/852; 29/885; 174/68.5; 427/97; 427/181; 427/195; 428/206; 428/207; 428/334; 428/335; 428/337; 428/901
[58] Field of Search ............... 29/625, 626, 852, 885; 174/68.5; 427/97, 181, 189, 195; 428/131, 137, 209, 418, 901, 206, 332, 334–337, 339

[56] References Cited

U.S. PATENT DOCUMENTS

| 3,140,195 | 7/1964 | Nagel | 427/185 |
|---|---|---|---|
| 3,377,699 | 4/1968 | Dinella et al. | 29/626 |
| 3,446,642 | 5/1969 | Webb | 427/185 |
| 3,934,334 | 1/1976 | Hanni | 29/626 |
| 4,188,415 | 2/1980 | Takahashi et al. | 427/97 |

OTHER PUBLICATIONS

*Western Elecric Technical Digest,* No. 19, Jul, 1970, p. 23.
*Plating,* Jan. 1974, pp. 47–52.

*Primary Examiner*—Bruce H. Hess
*Attorney, Agent, or Firm*—J. F. Spivak

[57] ABSTRACT

A method of fabricating a printed circuit board is disclosed. The method comprises forming a metal substrate having a through-hole pattern. The metal substrate is coated with a dielectric powder having a suitable flow length value to form a dielectric coat on the substrate having a sufficient through-hole edge coverage. The dielectric coated substrate is then treated with a second powder to form a satisfactory topcoat thereon. Electrical circuitry is then formed on the topcoat in conjunction with the through hole pattern.

5 Claims, 5 Drawing Figures

… … …

PRINTED WIRING BOARD

This is a continuation, of application Ser. No. 913,430 filed June 7, 1978, now abandoned, which is a division of application Ser. No. 785,480 filed Apr. 7, 1977, now U.S. Pat. No. 4,107,837.

BACKGROUND OF THE INVENTION

1. Field of the Invention

This invention relates to printed wiring boards and more particularly, to printed wiring boards utilizing metal substrates.

2. Description of the Prior Art

In both additive and subtractive techniques of printed circuit manufacture, a great variety of base materials have been employed as an insulating support. There is great interest in using thin metal blanks, e.g., 1 to 7 mils in thickness, which are coated with dielectric material, for flexible printed wiring boards. In the past, thicker, non-flexible metal blanks, e.g., 16 to 32 mils in thickness, have been coated with dielectric materials using a preheated substrate and a fluidized bed powder coating process or an electrostatic coating process. Both of these techniques have a disadvantage where thin (1 to 7 mils thick), flexible metal blanks are contemplated which contain through-holes. If such a thin metal blank is coated using known techniques, the dielectric coat obtained either does not provide adequate through-hole edge coverage, or, if it does provide adequate edge coverage, the resultant coating is too thick or the surface topography thereof is too rough and not useable, for practical purposes. If poor dielectric edge coverage is obtained, then a short will likely take place in the resultant printed wiring board between the metal blank or substrate and the conductive circuit pattern formed on the dielectric coat. If the dielectric coat is too thick, the flexibility of the resultant circuit suffers as well as results in an increase in material costs. Also, where the topography of the surface is rough and uneven, it is very difficult to print or stencil either a conductive pattern or a resist pattern thereon. Also, upon metallization of such a rough surface, the metal deposit obtained will have inherent mechanical stress therein resulting from rough topography.

A process which yields a flexible metal printed wiring board having a dielectric coated surface having good edge coverage as well as desirable topography properties is needed and is desired.

SUMMARY OF THE INVENTION

This invention relates to printed wiring boards and more particularly, to printed wiring boards utilizing metal substrates.

The method comprises forming a metal substrate having a through-hole. The metal substrate is coated with a dielectric powder having a suitable flow length value to form a dielectric coat thereon having a sufficient through-hole edge coverage.

BRIEF DESCRIPTION OF THE DRAWINGS

The present invention will be more readily understood by reference to the following drawing taken in conjunction with the detailed description, wherein.

DETAILED DESCRIPTION

Figure 1:
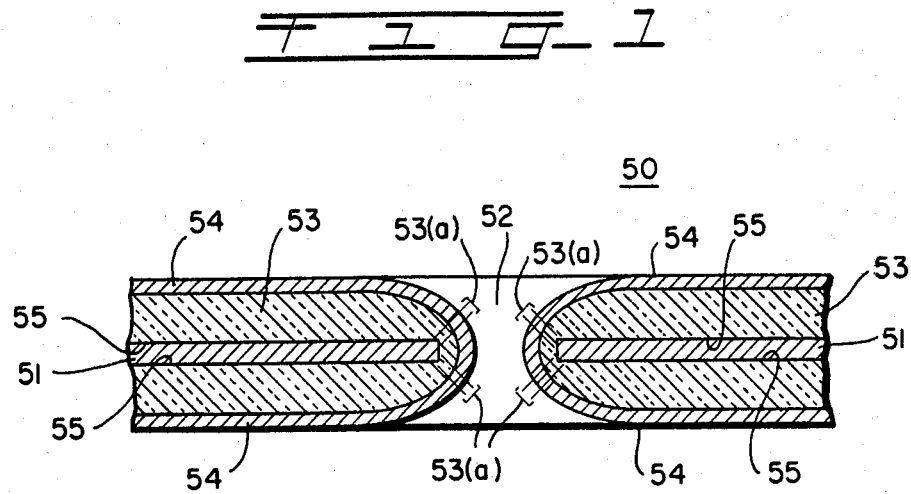
FIG. 1 is a cross-sectional view of a portion of a printed wiring board having a dielectric coating and a conductive layer thereon.
Figure 2:
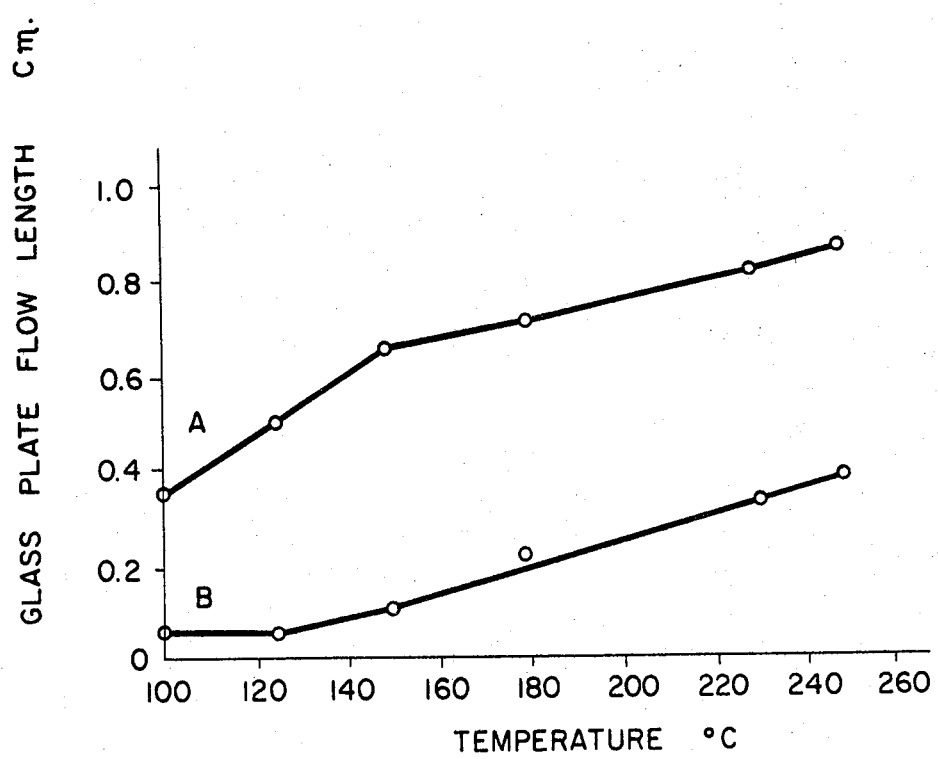
FIG. 2 is a graph plotting glass plate flow length in centimeters with temperature in degrees centigrade.

Referring now to FIG. 1, there is shown a cross-sectional view of a portion of a flexible printed wiring board 50 fabricated using conventional techniques, such as a fluidized powder bed or electrostatic coating technique. Board 50 has a metal substrate 51, typically ranging from about 1 to about 7 mils in thickness, with a circuit or through-hole 52. A dielectric coat 53 is formed on substrate 51. Deposited on coat 53 is a conductive layer 54 representing a portion of a circuit pattern. In fabricating board 50, using conventional techniques (fluidized bed, electrostatic powder coating), it has been found that the edge coverage 53(a) of coat 53 (from an edge of through hole 52 to conductive layer 54) is unsatisfactory in that it is too thin thereby leading to dielectric breakdown and electrical short circuiting of board 50. It has been found that dielectric coat 53 should have an edge coverage 53(a) having a thickness of at least about 40 percent of the principal thickness of coat 53. By "principal thickness" is meant the average thickness of dielectric coat 53 covering a principal surface 55 of metal substrate 51. Such an edge coverage is achieved by initially coating a metal substrate with a suitable dielectric powder having specific liquid flow or melt flow properties upon a melting thereof. Specifically, an adequate edge coverage is achieved by coating a metal substrate, as by an electrostatic technique, with a thermosetting dielectric powder having a suitable flow length value at a particular temperature, e.g., a glass plate flow length value of from about 0.1 cm. to about 0.65 cm. at 150° C. The glass plate flow length value is the value obtained with a procedure where 0.2 gm. of the particular dielectric powder is pressed into a 0.6 cm. diameter circular pellet (typically 8±1 mm. high) at a pressure of 2,000 pounds for ten minutes using a conventional pelleting apparatus. A typical conventional pelleting apparatus includes a chrome-plated steel cylindrical body (about 50 mm. in length) having a 0.6 cm. diameter round central aperture passing therethrough. Capping the lower end of the aperture is a base having a cylindrical steel rod (0.6 cm. in diameter by about 12.7 mm. in height) which is within the central aperture. The powder to be pelletized is maintained within the capped central aperture and a cylindrical top pressure or tamping rod (having a diameter of 0.6 cm. and a length of about 35 mm.) is inserted, under pressure, into the top of the powder loaded aperture to yield the desired pellet. The pellet is then placed at a 45° angle on a hospital grade glass microscope plate (as sold by Fisher Company and designated as "Fisher Brand Microslide"), maintained in an oven at a particular temperature, e.g., 150° C. The pellet at first melts and tends to flow until it sets again. The flow length is the total length of flow observed for the pellet plus the remaining pellets diameter minus the pellet's initial diameter (0.6 cm.) The flow length value is determined at any temperature between the melting point and the decomposition temperature of the thermosetting powder. Reference in this regard is made to FIG. 2 which illustrates the range of suitable glass plate flow length values which the thermosetting dielectric powder should have, e.g., 0.05 to about 0.35 cm. (100° C.); about 0.05 to about 0.50 cm. (125° C.); about 0.1 to about 0.65 cm. (150° C.); about 0.175 to about 0.70 cm. (180° C.); about 0.30 to about 0.80 cm. (225° C.); about 0.35 to about 0.90 cm. (250° C.). Suitable glass plate flow lengths for any temperature can be determined from the plot of FIG. 2, the ranges thereof being bounded by lines A and B thereof.

Figure 3:
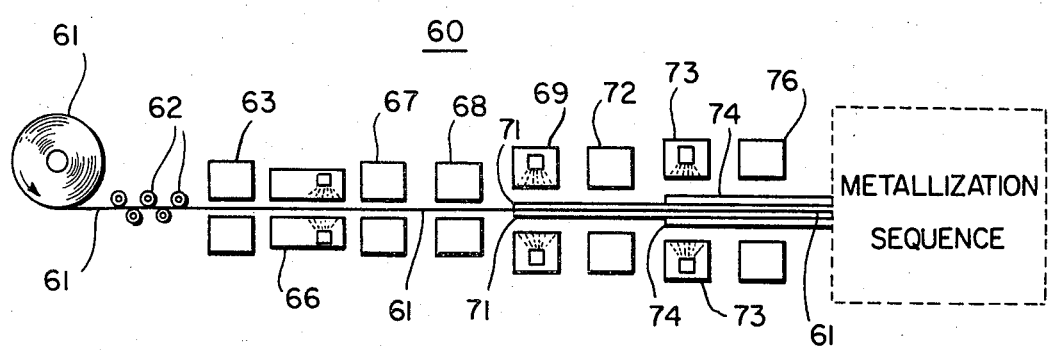
FIG. 3 is a block diagram of an assembly line for manufacturing printed wiring boards in accordance with the invention.
Figure 4:
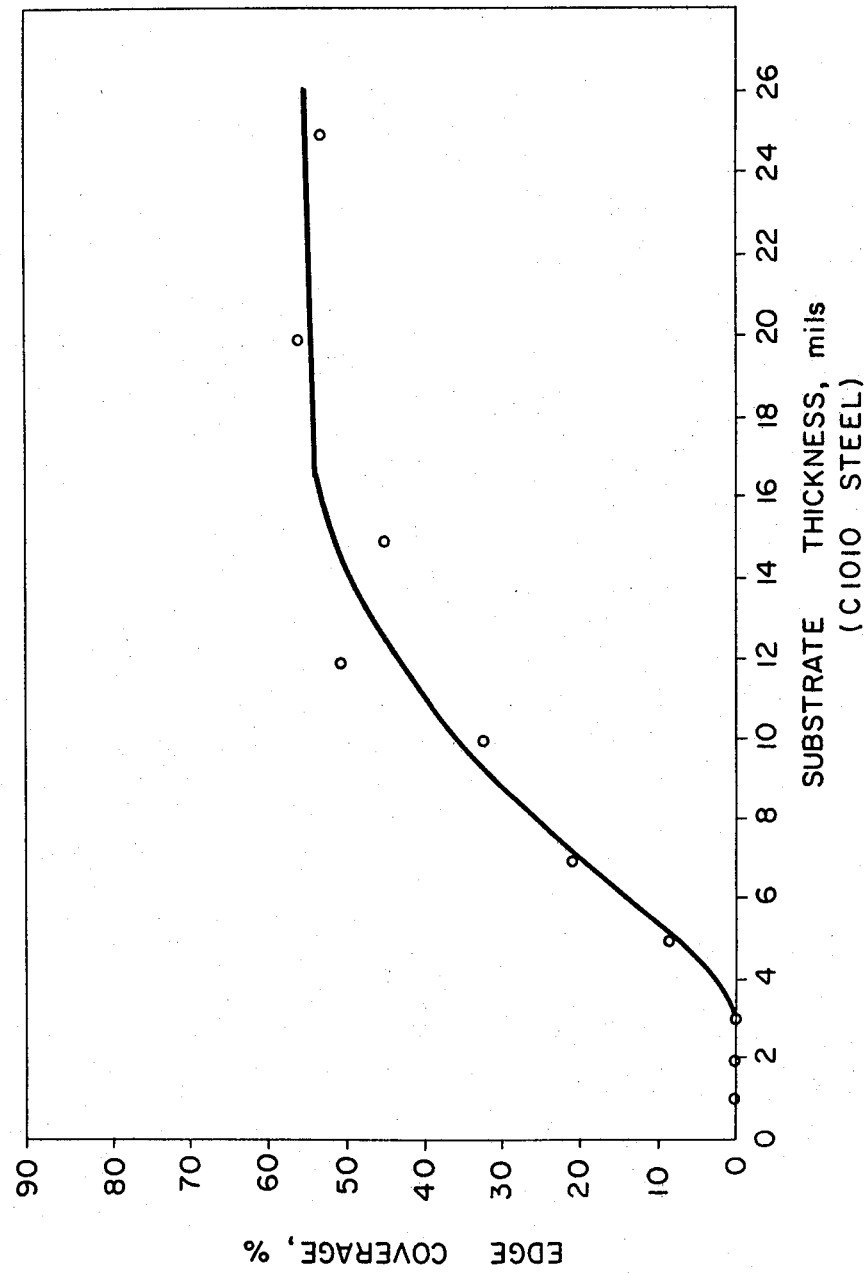
FIG. 4 is a plot of edge coverage in percent in relation to substrate thickness in mils.

Referring to FIG. 3, there is shown a continuous in-line fabrication line 60 having a coil of sheet metal 61 suitable to use as a substrate for a metal printed wiring board. Some suitable sheet metals include sheet steel, copper, aluminum and alloys of the foregoing. For the fabrication of flexible printed circuits the thickness of sheet metal ranges from 1 to 7 mils. If the sheet metal is less than 1 mil, there is a mechanical difficulty in handling the sheet metal leading to creasing thereof, as well as difficulty in defining the printed wiring substrates such as by stamping. Also, the resultant printed wiring substrate which would be a poor support for the ultimate dielectric coating and metallization, as well as being of poor dimensional stability. If the sheet metal is greater than 7 mils, then it would not be practical for a flexible printed circuit board since the flexibility is lost or greatly diminished with boards having a metal substrate in excess of 7 mils in thickness. It is to be noted hereat that metal substrates of up to 7 mils in thickness inherently have poor edge coverage of their through-holes unless the subject invention is employed. Reference is made to FIG. 4 which is a plot of various sheet steel (C1010 steel) substrates which have been electrostatically coated with a thermosetting epoxy powder which did not have the requisite viscosity or glass plate flow length value. The powder had a glass plate flow length value of 0.7 cm. at 150° C. As can be seen from FIG. 4, a metal substrate up to 10 mils in thickness does not get adequate edge coverage. This inadequacy is due to the fact that in relatively thin metal substrates (1 to 10 mils thick), the surface tension effect dominates upon the melting of the coating powder. If the powder does not have the desired fluid characteristics, the surface tension effects at the sharp edges of the through-holes predominates and causes the melt (molten powder) to pull away therefrom, thereby leading to a poor edge coverage.

Figure 5:
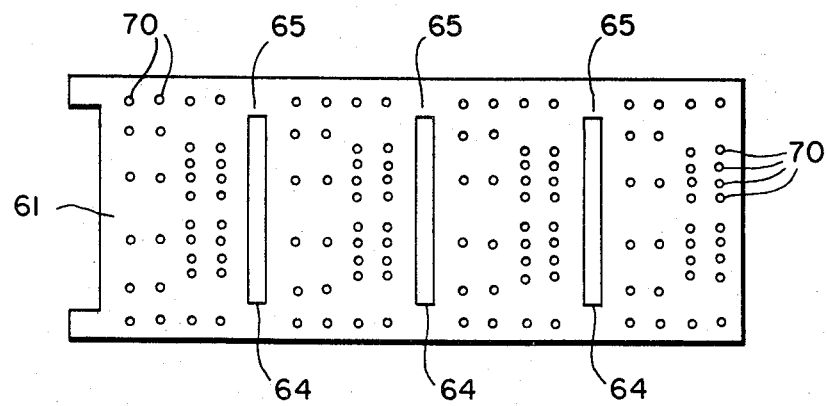
FIG. 5 is a fragmentary view of metal substrates for printed wiring boards as blanked.

Referring back to FIG. 3, the coil of sheet metal 61 is initially fed into any coventional straightener, illustratively a roller type stock straightener 62. The rolls of the metal straightener 62 pull sheet 61 from the coil and after straightening, sheet 61 passes into any conventional apparatus 63, illustratively an electron discharge machining apparatus, for forming a plurality of metal substrates having a desired pattern of circuit or through-holes. Other apparatus 63 which may be employed include drilling, punch press, chemical milling and electrochemical machining apparatus. Referring to FIG. 5, apparatus 63 (FIG. 3) shapes sheet 61 into a plurality of desired substrate configurations 64, while leaving interconnecting tabs 65 between the individually configured substrates 64 to retain the substrates 64 in sheet or tape form. Apparatus 63 (FIG. 3) also forms a pattern of apertures or through-holes 70 for through-hole connections.

Referring back to FIG. 3, the blanked metal sheet 61 is passed through a conventional degreaser 66. Degreaser 66 may be of the spray type which includes a compartment for a vapor type degreaser such as, for example, trichloroethylene; a tank containing a rust removal chemical such as, for example, a solution of hydrochloric acid, a first water rinse compartment for rinsing off hydrochloric acid; a second tank containing an alkaline solution such as, for example, that sold under the trademark Oakite 190; a second water rinse compartment for rinsing away the alkaline solution; a third tank containing a zinc-phosphate solution which may be, for example, that sold under the trademark Phosdip R2; and a second degreaser compartment where the blanked metal sheet is degreased and vapor dried with, for example, trichloroethlyene. The blanked sheet metal is subjected to the degreasing vapor for about 5 to 10 minutes, the rust removal chemical until the rust or metal oxide, if any, is removed, the alkaline solution for about 3 to 5 minutes, the zinc phosphate solution for about 6 minutes, and the drying vapor until dry.

The blanked sheet metal 61 is next prepared for electrostatic powder coating by drawing the metal sheet 61 through a cleaning station 67 where it is cleaned, as for example with aqueous phosphoric acid, washed and then dried in an oven 68 which may be an infrared type oven, typically maintained at 150° C. The dried blanked sheet metal 61 is then inserted into a powder booth or bed 69. The booth or bed 69 is equipped with either conventional manually operated or automatic powder coating guns for electrostatically powder coating the blanked sheet metal 61 to obtain a dielectric coat 71 thereon. Some typical conventional electrostatic powder spraying apparatus and techniques are described in Fundamentals of Powder Coating, Society of Manufacturing Engineers, 1974.

It is again to be pointed out and stressed hereat that unless a suitable thermoset powder is employed in the electrostatic coating process an unsuitable dielectric coat through-hole edge coverage, such as that shown at 53(a) in FIG. 1, will be obtained. Such a suitable powder is one having critical fluid characteristics upon melting as reflected by a suitable glass plate flow length value, e.g., 0.1 cm. to 0.65 cm. at 150° C. If the powder employed has, at a particular temperature, a flow length value greater than the suitable flow length value as indicated in FIG. 2, little or no through-hole edge coverage is obtained. If on the other hand the powder employed has a flow length value less than the suitable flow length value within the bounded area of FIG. 2 (at the particular temperature), adequate edge coverage is obtained, but the resultant dielectric surface is much too rough and irregular for purposes of a printed wiring board.

Any thermosetting powder can be employed which exhibits the required glass plate flow value. Some suitable dielectric powders which may be employed are epoxy resin powders, polyesters, acrylics, etc.

Dielectric coat 71 has a thickness sufficient to impart the degree of insulation desired without imparting a rigidity which destroys the flexibility. For flexible printed wiring boards, having a metal substrate of 1 to 7 mils, a total dielectric coat having a thickness of up to 7 mils per principal surface of the metal substrate can be accommodated before there is a rigidity obtained which destroys the use of such a composite as a flexible printed wiring board. For flexible printed wiring boards, a total dielectric coat, comprising a single layer or a plurality of discrete layers, having a thickness on each principal surface in excess of 7 mils imparts an undesirable rigidity and an additional undesirable cost. Typically, dielectric coat or layer 71 has a thickness of about 3 to 4 mils.

After powder coating, the dielectric coated blanked sheet metal 61 is heated in an oven 72 at a temperature and for a time period sufficient to fuse the resultant dielectric coating 71 on the metal sheet 61. For a thermosetting resin, such as an epoxy resin, the sheet 61 and dielectric coat 71 are heated in oven 72 at a temperature sufficient to fuse the powder and cure the resin to the "B" stage. Typically, for an epoxy resin, sheet metal 61 and coat 71 are heated at 240° C. for one minute. The resultant fused and partially cured dielectric coat 71 insulates the metal substrates of sheet metal 61 from the electrical circuitry destined to be formed on the top surface of the resultant printed wiring board.

Where a relatively smoother dielectric surface is required, the sheet metal 61 having dielectric layer 71 thereon is further treated with a second powder having a melt flow characteristic to impart the desired smoothness to the dielectric coat 71. A suitable second powder is one having for example a glass plate flow length value at 150° C. of about 1.2 cm. to about 1.5 cm. Typically the second powder has a glass plate flow length in excess of the ranges illustrated in FIG. 2. In this regard, it is to be pointed out that the second powder may comprise a resin composition which is the same as the first powder, but which has been treated in a different fashion, e.g., it has not been aged or it has been cured to a lesser extent, or the second powder may comprise a different resin composition (thermosetting or thermoplastic) than the first powder. It is of course to be understood that suitable second powders are easily ascertained by one skilled in the that art to impart the smoothness desired or required.

The dielectric coated sheet metal 61 is directly passed from oven 72 into a second electrostatic powder booth or bed 73. A smooth topcoat 74, comprising the second powder material, is obtained on dielectric coat 71. The thickness of topcoat 74 is only enough to impart the required smoothness to dielectric layer or coat 71. Typically, for a 1 to 7 mils thick steel substrate having a 3 to 4 mils thick dielectric layer on each principal surface, the topcoat is about 1 to 2 mils thick on each principal surface.

The resultant top coated sheet metal 61 is then passed into an oven 76 where the top coat 74 is fused to form a continuous coating and to obtain a full cure of any thermosetting resin which may be employed in coat 71 and/or 74. Typically, where an epoxy resin is employed in forming coat 71 and/or 74, the top coated sheet metal 61 is heated in oven 76 at a temperature of 240° C. for 3 to 5 minutes. By a full cure is meant that the resultant cured resin has been optimized, to the extent possible, with respect to electrical properties, mechanical properties and chemical resistance, i.e., with respect to criteria which are well known in the art and are easily ascertainable experimentally by one skilled in the art. Where an epoxy resin is cured, a full cure typically means that the epoxy or oxirane groups initially present have been consumed during the curing and the degree of cross-linking provides optimum physical properties for a desired application.

The resultant insulated sheet metal 61 is then passed through standard metallization processes to achieve selective metallization in the form of a desired electrical circuit pattern. In this regard, it is to be noted that an electroless metal catalyzing species, e.g., palladium metal, may be incorporated into topcoat 74 to form a catalytic layer which can be metallized. However, any conventional metallization technique may be used such as vapor plating, electroless plating, vacuum plating, etc. Typically, the surface of topcoat 74 is subjected to a conventional electroless metal deposition sequence in which a catalytic species is deposited thereon which catalyzes the reduction and deposition of a metal from an electroless metal deposition solution. The surface of topcoat 74 may be blanket metallized followed by subtractive patterning thereof or may be selectively metallized to achieve the desired conductive circuit. Some typical suitable processes are disclosed by I. B. Goldman, Plating, January 1974, pages 47 through 52, incorporated hereinto by reference.

Another metallizing technique involves depositing a conductive ink or adhesive on the surface of topcoat 74 followed by photoresist masking and electroless metallization thereof. U.S. Pat. No. 3,934,334, incorporated hereinto by reference, discloses one such process.

EXAMPLE I

A. A powder composition was prepared comprising (1) 49.5 weight percent of a diglycidyl ether of bisphenol A having an epoxide equivalent weight of 750, a Durran's softening point of 92° C. ("EPON 2001" obtained from Shell Chemical Company); (2) 7.6 weight percent of a diglycidyl ether of bisphenol A having an epoxide equivalent weight of 2000 to 2500, and a Durran's softening point of 125° to 135° C. ("EPON 1007" obtained from Shell Chemical Company); (3) 7.6 weight percent of a brominated diglycidyl ether of bisphenol A containing about 21±2 percent bromine, having an epoxide equivalent weight of 455 to 500 and a Durran's softening point of 70° to 80° C. ("ARALDITE 8011" obtained from Ciba Products Company); (4) 11.4 weight percent of a brominated carboxyl terminated acrylonitrilebutadiene copolymer having a Brookfield viscosity of 550 to 750,000 cps at 27° C. and 26 to 28 weight percent acrylonitrile ("HYCAR CTBN 1300X13" obtained from B. F. Goodrich Co.); (5) 1.0 weight percent red iron oxide; (6) 5.0 weight percent antimony oxide; (7) 14.0 weight percent titanium oxide; (8) 2.3 weight percent of an amine curing agent ("D.E.H.-40" obtained from the Dow Chemical Company; and (9) 1.5 weight percent of dicyandiamide.

A 3 inch by 6 inch by 1 mil thick steel (C1010 steel) foil having electron discharge machined through holes therein was degreased by immersion for 3 minutes in a 1,1,1-trichloroethane bath maintained at 71° C. The degreased foil substrate was then cleaned in a 8.2 weight percent aqueous $H_3PO_4$ solution maintained at 71° C. for 3 minutes. The substrate was then dried in a convection oven maintained at 150° C. for 3 to 5 minutes.

The prepared powder was aged at 55° C. for about 8 hours to yield a powder having a glass plate flow length value of about 0.4 cm. at 150° C. The dried substrate was then powder coated with the prepared and aged powder composition using a conventional manual powder coating apparatus (GEMA Type 710 spray apparatus) to yield a 6 to 10 mils thick, unfused powder coat. The powder coated substrate was heated in an infrared oven at 240° C. for one minute whereby a 3 to 4 mils thick fused powder coating was obtained on each principal substrate surface. The resultant coating gave an adequate edge coverage of the through hole as evidenced by microscopically examining the cross-sectional area thereof at a magnification of 100. Pictures of the cross-sectional area of the coated through hole were also taken and the edge coverage measured therefrom was at least 40% of the principal thickness of the coating, that is of the principal surface coating thickness.

B. The procedure of Example I-A was repeated except that a topcoat was applied to the coated surface. A powder formulation was prepared which comprised (1) 25 weight percent of a diglycidyl ether of bisphenol A having an epoxide equivalent weight of 750 and a Durran's softening point of 92° C. ("DRH 201" obtained from Shell Chemical Company; (2) 25.2 weight percent of a brominated epoxy resin having an epoxide equivalent to 600 to 750, having a Durran's softening point of 90° to 100° C. and containing 42% bromine ("EPI-REZ 5183" obtained from Celanese Corporation); (3) 12.6 percent of "EPON 1007" obtained from Shell Chemical Company; (4) 12.6 weight percent of a diglycidyl ether of bisphenol A having an epoxide equivalent weight of 2500 to 4000 and a Durran's softening point of 145° to 155° C. ("EPON 1009" obtained from Shell Chemical Company); (5) 10.1 weight percent of a brominated carboxyl terminated acrylonitrile-butadiene copolymer having a Brookfield viscosity of 550 to 750,000 cps at 27° C. and 26 to 28 weight percent acrylonitrile ("HYCAR CTBN 1300X8" obtained from B. F. Goodrich Company); (6) one weight percent of red iron oxide; (7) 10 weight percent of antimony oxide; (8) 1.8 weight percent of an amine curing agent ("D.E.H. 40" obtained from the Dow Chemical Company); (9) 1.2 weight percent of dicyandiamide; and (10) a 0.05 weight percent of Resimix P flow aid obtained from Mohawk Industries. The prepared powder had a glass plate flow length of about 1.2 cm. at 150° C. The prepared powder was applied with the apparatus of Example I-A to form an unfused topcoat 3 to 5 mils thick on each principal substrate surface. The resultant composite was then fired in an infrared oven at 240° C. for 3 to 5 minutes to fully cure both powder coatings and to yield a smooth topcoat having a thickness of 1 to 2 mils on each principal surface.

EXAMPLE II

The procedure of Example I-A was repeated except that the first powder coating was obtained using a powder formulation comprising (1) 21 weight percent of "EPON 2001" obtained from Shell Chemical Company; (2) 7.6 weight percent of "EPON 1007" obtained from Shell Chemical Company; (3) 15.2 weight percent of "EPON 1009" obtained from Shell Chemical Company; (4) 21 weight percent of "EPI-REZ 5183" obtained from Celanese Corporation; (5) 11.4 weight percent of a brominated carboxyl terminated acrylonitrile-butadiene copolymer ("HYCAR CTBN 1300X9" obtained from B. F. Goodrich Company); (6) 1.82 weight percent of an amine curing agent ("D.E.H. 40" obtained from the Dow Chemical Company); (7) 1.22 weight percent of dicyandiamide; (8) 5 weight percent of antimony oxide; (9) 14 weight percent of titanium dioxide; and (10) 2.0 weight percent of an inorganic pigment ("10334 Brite Blue" obtained from Drakenfeld/Hercules Incorporated). The powder was aged at 55° C. for about 12 hours to obtain an aged powder having a glass plate flow length of about 0.1 cm. at 150° C.

A 3 to 4 mil fused coating of the powder was obtained on the principal surfaces of the substrate. A second powder comprising the unaged formula was then applied by the same apparatus to the coated surface and heated at 240° C. for 3 to 5 minutes to fully cure both powder coatings and to obtain a smooth topcoat having a thickness of 1 to 2 mils. Again microscopic and photographic examination of the cross section of the through holes indicated that an edge coverage of at least 40% of the principal surface coating thickness was obtained.

EXAMPLE III

The procedure of Example I-A was repeated except that the dielectric coat was obtained from a powder formulation comprising (1) 20.1 weight percent of "EPON 2001" obtained from Shell Chemical Company; (2) 3.6 weight percent of "EPON 1007" obtained from Shell Chemical Company; (3) 7.3 weight percent of "EPON 1009" obtained from Shell Chemical Company; (4) 5.5 weight percent of "HYCAR CTBN 1300X13" obtained from B. F. Goodrich Company; (5) 2 weight percent of red iron oxide; (6) 30 weight percent of alumina trihydrate (Alcoa Hydral 705); (7) 30 weight percent of alumina trihydrate (Alcoa Hydral 710); and (8) 1.5 weight percent of an accelerated amine type curing agent which has an amine-nitrogen content of 54.5 to 57.5 percent by weight ("P-108" obtained from Shell Chemical Company). The mixture had a glass plate flow length of 0.15 cm. at 150° C. Essentially the same edge coverage results as in Example I-A were obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A printed circuit board comprising:
   (a) a metal substrate having a thickness of from about 1 to about 7 mils and a through hole; and
   (b) a dielectric coat on said substrate fused from particles of a thermosetting material having a flow length value defined by the area extending between lines A and B in the graph of FIG. 2, said dielectric coat having a through hole edge coverage of at least about 40 percent in thickness of the principle thickness of the dielecric coat.

2. The printed circuit board as defined in claim 1 which further comprises a conductive pattern on said dielectric coat.

3. A printed circuit board comprising:
   (a) a metal substrate having a thickness of from about 1 to about 7 mils and a through hole;
   (b) a dielectric coat on said substrate fused from particles of a thermosetting material having a flow length value defined by the area extending between lines A and B in the graph of FIG. 2, said dielectric coat having a through hole edge coverage of at least about 40 percent in thickness of the principle thickness of the dielectric coat; and
   (c) a dielectric top coat on said dielectric coat wherein said topcoat is applied from a powder having a flow length value above curve A of FIG. 2.

4. The printed circuit board as defined in claim 3 which further comprises a conductive circuit pattern on said topcoat.

5. The printed circuit board as defined in claim 3 wherein said topcoat flow length value is from 1.2–1.5 cm.

* * * * *